United States Patent
Ho et al.

(10) Patent No.: US 8,522,176 B2
(45) Date of Patent: Aug. 27, 2013

(54) METHOD OF RECORDING AND REPLAYING CALL FRAMES FOR THE TESTBENCH

(75) Inventors: Chia-Ling Ho, New Taipei (TW); Jian-Cheng Lin, Yunlin County (TW); Jencheng Wang, Hsinchu County (TW)

(73) Assignee: Synopsys, Inc., Mountain View, CA (US)

( * ) Notice: Subject to any disclaimer, the term of this patent is extended or adjusted under 35 U.S.C. 154(b) by 263 days.

(21) Appl. No.: 13/103,099

(22) Filed: May 8, 2011

(65) Prior Publication Data

US 2011/0283247 A1 Nov. 17, 2011

Related U.S. Application Data

(60) Provisional application No. 61/333,262, filed on May 11, 2010.

(51) Int. Cl.
*G06F 9/455* (2006.01)
*G06F 17/50* (2006.01)

(52) U.S. Cl.
USPC ............ 716/106; 716/107; 716/111; 716/136

(58) Field of Classification Search
USPC .................................. 716/106, 107, 111, 136
See application file for complete search history.

(56) References Cited

U.S. PATENT DOCUMENTS

| | | | | |
|---|---|---|---|---|
| 5,809,283 A | * | 9/1998 | Vaidyanathan et al. | 703/16 |
| 5,841,967 A | * | 11/1998 | Sample et al. | 714/33 |
| 5,903,475 A | * | 5/1999 | Gupte et al. | 703/16 |
| 6,058,492 A | * | 5/2000 | Sample et al. | 714/33 |
| 6,498,999 B1 | * | 12/2002 | Reise | 702/120 |
| 7,096,440 B2 | * | 8/2006 | Fechser | 716/103 |
| 2003/0110477 A1 | * | 6/2003 | Wakabayashi et al. | 717/135 |
| 2004/0078178 A1 | * | 4/2004 | Blasi et al. | 703/15 |

* cited by examiner

*Primary Examiner* — Sun Lin
(74) *Attorney, Agent, or Firm* — Kilpatrick Townsend & Stockton LLP (57) ABSTRACT

A computer-implemented method to debug testbench code of a testbench associated with a circuit design by recording a trace of call frames along with activities of the circuit design. By correlating and displaying the recorded trace of call frames, the method enables users to easily trace an execution history of subroutines executed by the testbench thereby to debug the testbench code. In addition, users can trace source code of the testbench code by using the recorded trace of call frames. Furthermore, users can debug the testbench code utilizing a virtual simulation, which is done by post-processing records of the virtual simulation stored in a database.

23 Claims, 9 Drawing Sheets

First call-back routine:
1. Set the index of the call frame
2. Set ID of callee as subroutine_Y
3. Set the tag as BEGINNING
4. Set ID of caller as subroutine_X
5. Capture the first simulation time
6. Keep the code position
7. Collect the initial variable status
8. Record the corresponding ending call frame index

Second call-back routine:
1. Set the index of the call frame
2. Set ID of callee as subroutine_Y
3. Set the tag as END
4. Set ID of caller as subroutine_X
5. Capture the second simulation time
6. Keep the code position
7. Collect the latest variable status
8. Record the corresponding beginning call frame index

METHOD OF RECORDING AND REPLAYING CALL FRAMES FOR THE TESTBENCH

CROSS REFERENCE TO RELATED APPLICATIONS

This application claims the benefit of U.S. Provisional Application No. 61/333,262, filed May 11, 2010, and entitled "Method and system for function trace debugging in SystemVerilog", which is hereby incorporated herein by reference.

BACKGROUND OF THE INVENTION

1. Field of the Invention

The present invention relates to a computer-implemented method for debugging a circuit design with a testbench in the field of integrated circuit (IC) design, and in particular to a method for debugging the testbench using post-processing approach.

2. Description of the Prior Art

Post-processing approach is often used for hardware debugging since saved simulation results are sufficient to provide hardware engineers with the ability to debug the hardware design. During hardware simulation, signal values at circuit nodes will be recorded for debugging throughout the entire simulation. Moreover, signal values only change at discrete simulation times. Therefore, during hardware simulation, signal value changes are often saved in files (also called dump files) in industry standard formats, such as Value Change Dump (VCD) or Fast Signal Database (FSDB). During post-processing debugging, waveform viewers are often used to read VCD or FSDB files to display signal value changes with respect to simulation times for helping users debug the behavior of the hardware design conveniently.

The testbench written in high level language, such as SystemVerilog or C++, however, is more like traditional software in that objects can be created and deleted dynamically; variable values can change again and again while the simulation time stays unchanged; and functions and tasks (which will be collectively referred to as "subroutines" hereafter) can be called recursively if so desired. Using the conventional way of hardware debugging, such as signal value dumps and waveform viewing, is inadequate for debugging the testbench. Therefore, it is better to use a software debugging approach to debug the test bench, much like using an interactive debugger such as "GNU Debugger (GDB)" to debug a C++ program. While it's possible to do interactive debugging for the testbench, users often suffer from poor performance due to the simulator spending a long time evaluating the hardware part.

Therefore, in conventional hardware simulation and debugging, it is very difficult to integrate both hardware debugging and testbench debugging together due to their intrinsic differences in operations.

SystemVerilog provides an advantage in addressing the verification complexity challenge. However, there is a gap for IC designers when it comes to the debug and analysis of SystemVerilog testbench (SVTB). The accepted "dumpvars-based" techniques are not practical for the object-oriented testbench. Nevertheless, engineers do need to know what the testbench is doing at any given point in time. Thus far, engineers have been forced to revert to low-level, text-based message logging and subsequent manual analysis of the resulting text log files. Logging—the process of recording the history—has been widely used in systems and software environments.

Most SystemVerilog libraries used today provide some built-in utilities to log messages generated from the testbench into a low-level text files that can be analyzed after simulation, engineers then manually correlate the testbench data to the design activity in order to debug the testbench. Therefore, this is a painful and ineffective approach to debug the testbench itself by using the logging messages alone.

U.S. Pat. No. 6,934,935 entitled "Method and Apparatus for Accurate Profiling of Computer Programs" discloses a method and apparatus for profiling the execution of a computer program, including the actual CPU cycles spent in each function and the caller-callee (i.e., who-calls-who) relationships. To collect the runtime data, it has to insert software codes into the program. The collected data can be used to analyze the performance of the program and provide hints as to which parts of the program can be optimized to speed up the execution of the program. However, in testbench code executions, the focus is not on the CPU cycles spent in each subroutine. Consequently, the disclosure of U.S. Pat. No. 6,934,935 is aimed at evaluating software performance, but not debugging a testbench.

Therefore, what is needed is a technique to record the behavior of SVTB functions and tasks at the same time with the activities of the DUT so that the history of the testbench execution can be correlated to the DUT in a simulation by using the same simulation time stamps. Then, the recorded information can be used to provide post-processing debugging capabilities to users so that the DUT and SVTB can be debugged together effectively and efficiently.

SUMMARY OF THE INVENTION

One object of the present invention is to provide a solution to display both the DUT simulation results and testbench execution history on graphic windows correlatively at the same simulation time. Thus users can debug DUT and testbench simultaneously in an efficient way.

One embodiment in the present invention is to provide a computer-implemented method to record necessary debugging information, comprising testbench call history, into a database by the following steps. First, for each subroutine (that is, a SystemVerilog task or function) of the plurality of the subroutines in the testbench, providing a first call-back routine which will be called before the code section of the subroutine is executed. Next for each subroutine of the plurality of the subroutines in the testbench, providing a second call-back routine which will be called after the code section of the subroutine is executed. Then, the simulation controlled by a simulator for testing a hardware or IC design can be started, wherein the simulator timing control will decide when to advance the simulation time one step at a time from zero until the end of the simulation. To those skilled in the art, it is a straight forward manner to register such call-back routines for a subroutine using System Verilog Programming Language Interface (PLI) functions.

After the simulation started, for each subroutine of the plurality of the subroutines in the testbench, recording the first simulation time at which the corresponding first call-back routine is executed, a tag indicating the beginning of the subroutine, and the identification of the subroutine in the call frame when the corresponding first call-back routine is called. Next, for each subroutine of the plurality of the subroutines in the testbench, recording the second simulation time at which the corresponding second call-back routine is executed, a tag indicating the ending of the subroutine, and the identification of the subroutine in the call frame when the corresponding second call-back routine is called.

As a result, the trace of call frames is formed according to the order of the call-backs that are called one by one at their respective simulation times, which can be saved into a database for analyzing latter on.

With testbench call history and other information, such as log messages and value change data, recorded in a database, we can display waveforms and log messages in graphic windows for users to debug the testbench code along with the DUT. Furthermore, the testbench call history can also be shown to users in graphic windows in the format of call frames according to a specified simulation time at which the call frames are recorded. Users can easily obtain the information of the call stacks at specific simulation time by simply clicking on the waveform window to display them. In addition, by clicking the corresponding fields in call frames, users can quickly find the corresponding source code segments running at the specified simulation time.

Moreover, users can run the simulation virtually according to the records in the database; in other words, users can virtually run the simulation again and again to debug the testbench and DUT without actually running the simulation with the simulator. For example, user can set a breakpoint first, and then the virtual simulation will stop at the breakpoint quickly without re-running the simulation.

Accordingly, with the features mentioned above, users can debug DUT and testbench code in an interactive way through a user friendly graphic interface efficiently and effectively.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
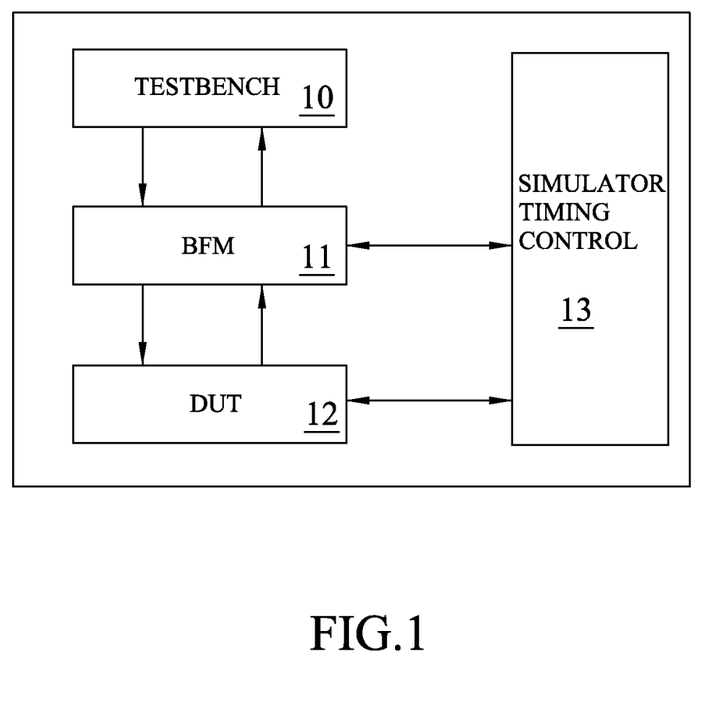
FIG. 1 is a schematic block diagram of a testbench environment.

Environment Introduction:

Firstly, please refer to FIG. 1, which is a schematic block diagram of a typical testbench environment. In order to test a DUT 12, testbench 10 generates test patterns which comprise transactions to a Bus Functional Model (BFM) 11 module. The BFM 11 is responsible for translating the transactions into bus operations to the DUT 12. The BFM 11 also receives the bus operations from DUT 12 and eventually gets back to testbench 10 in order to prepare the next transaction for testing the DUT 12. Please note that only the BFM 11 and the DUT 12 will consume simulation times to emulate the real hardware behavior.

Simulator timing control 13 will decide when it is necessary to advance the simulation time, simulator evaluates all the blocks or statements in the testbench 10 and the DUT 12 at any given step of simulation time, the simulator timing control 13 will advance the step of the simulation time when the blocks or statements containing time consuming operators are the only ones left to be evaluated after all other blocks or statements have been evaluated already. The time consuming statements include many different types, such as time delay statements or wait statements in Verilog.

Thus BFM 11 and DUT 12 containing time consuming operators will consume simulation times. The testbench 10 comprises two types of subroutines: first type of subroutine, which do not call BFM 11 either directly or indirectly, will have the same simulation time recoded at the beginning and the ending of the subroutine execution; and the second type of subroutine, which calls BFM 11 either directly or indirectly to send transaction data to DUT 12, will have different simulation times recorded at the beginning and the ending of the subroutine execution due to the simulation time delays in BFM 11 which contains time consuming operators.

Figure 2:
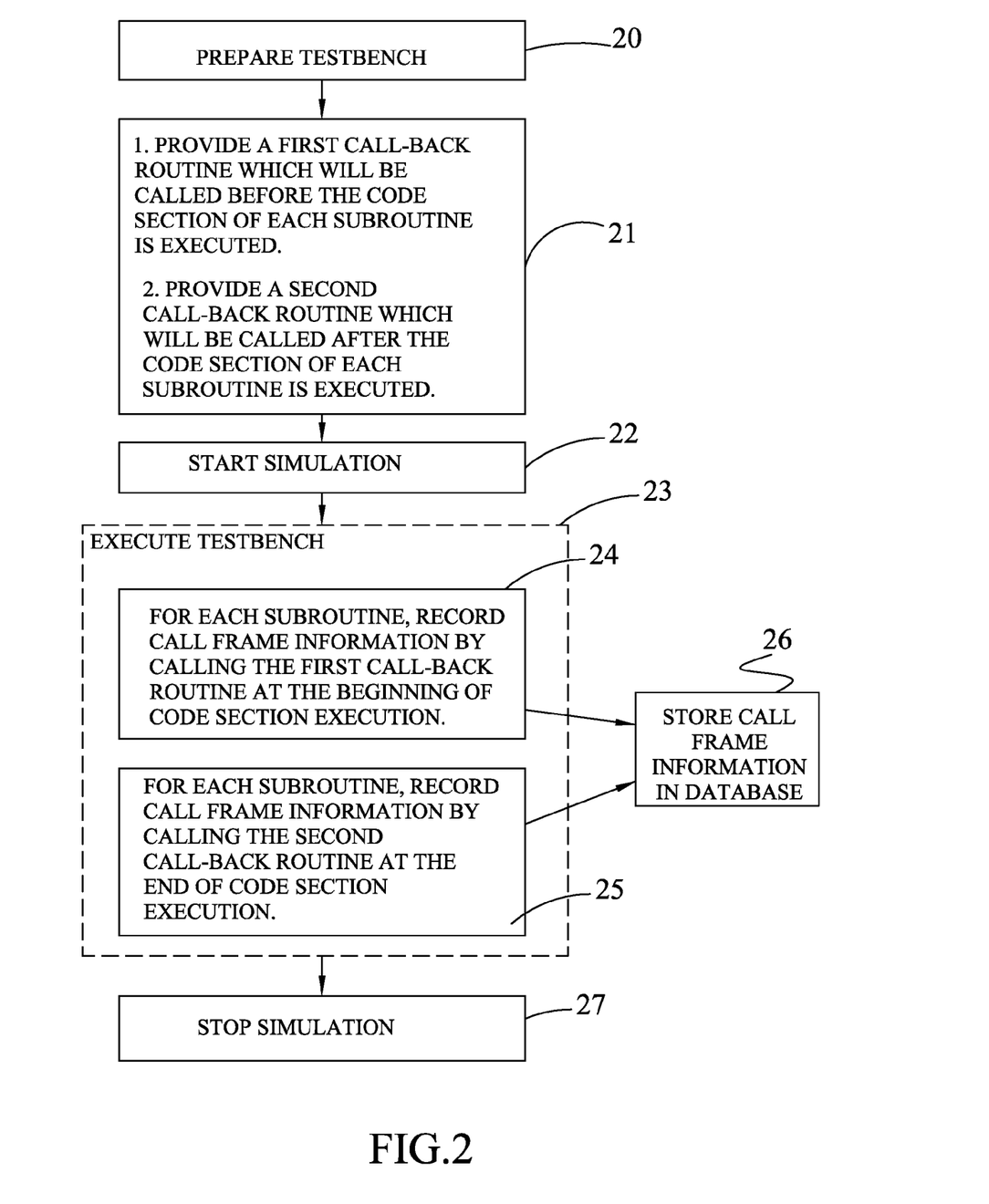
FIG. 2 is a schematic block diagram of the present invention.

Call Frame Recording:

Next, please refer to FIG. 2, which is a flow chart to illustrate one embodiment of the present invention. The testbench, as illustrated in step 20, includes a program block, a plurality of classes containing subroutines and variables.

In step 21, a recording control module, called PLI module hereafter, is introduced; the PLI module serves as a control program to register the call-backs and obtain information pertaining to the testbench through the SystemVerilog Programming Language Interface (PLI). For instance, through the PLI module, a first call-back routine and a second call-back routine can be registered, and information such as status of variables and arguments of a subroutine can be obtained so that the call-back routines can record them respectively.

In another embodiment for step 21, an invocation of first call-back routine can be provided by inserting a call statement to call the first call-back routine before the code section of each of the subroutine; and an invocation of second call-back routine can be provided by inserting a call statement to call the second call-back routine after the code section of each of the subroutine.

After the first and the second call-backs are provided, the simulation starts as in step 22. In step 23, once a subroutine is called in the testbench, the corresponding first call-back routine will be executed first to record the call frame as shown in step 24 and store the data into a database in step 26. And then the code section of the subroutine will be executed to perform the original task of the subroutine. After the code section of the subroutine is executed, the corresponding second call-back routine will be executed to record the call frame in step 25 and store the information into a database in step 26. Since subroutines are executed one after another, the information and activities associated with the subroutines will be stored into the database in the order the subroutines are executed at their respective simulation times, thereby forming a trace of call frames in the order of the call-back routines that are executed one by one at their respective simulation times, wherein the call frame contains the simulation time at which the call-back is called. With the testbench executed and call frames recorded, the simulation stops in step 27.

To further describe the call frame mentioned above, please refer to FIG. 3A which depicts a data structure of a beginning call frame 3a with a set of important debugging information including: the index of the call frame 31a which is an accumulated count showing the ordinal of the call frame; the identification of the subroutine 32a to identify the subroutine by using a subroutine ID or a unique name to represent the subroutine; the tag 33a to indicate the beginning of the subroutine which is about to be executed; the first simulation time 34a to record the simulation timestamp when the subroutine execution begins; the identification of the caller subroutine 35a which calls the subroutine; the code position 36a including a line-number of the source file at which the subroutine call is executed and a count to indicate number of times that the subroutine calls are executed at the line-number; the variable status 37a which is the initial variable status which records the values of arguments and variables accessible to the subroutine at the beginning of the execution of the subroutine; the ending call frame index 38a which records the index of the corresponding ending call frame paired with the current beginning call frame.

Figure 3A:
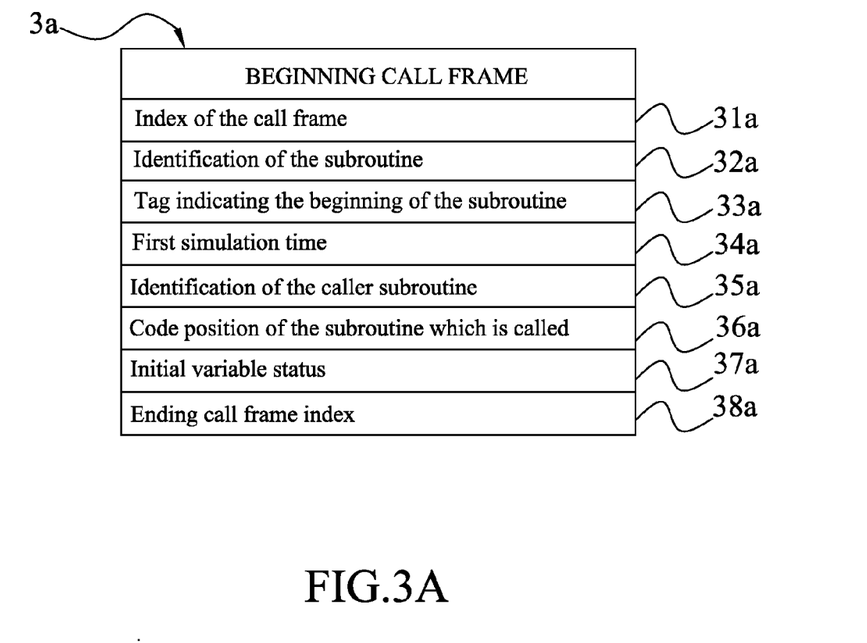
FIG. 3A illustrates the definition for data structure of beginning call frame.
Figure 3B:
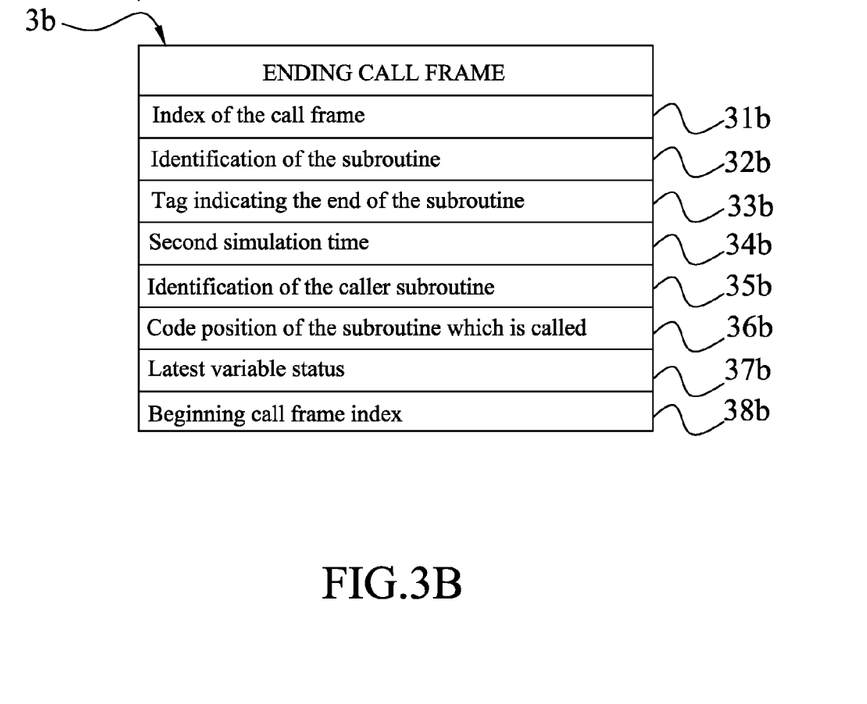
FIG. 3B illustrates the definition for data structure of ending call frame.

Next, please refer to FIG. 3B which depicts a data structure of an ending call frame 3b with a set of important debugging information including: the index of the call frame 31b which is an accumulated count showing the ordinal of the call frame; the identification of the subroutine 32b to identify the subroutine by using a subroutine ID or a unique name to represent the subroutine; the tag 33b to indicate the ending of the subroutine which has been executed; the second simulation time 34b to record the simulation timestamp when the subroutine execution ends; the identification of the caller subroutine 35b which calls the subroutine; the code position 36b including a line-number of the source file at which the subroutine call is executed and a count to indicate number of times that the subroutine calls are executed at the line-number; the variable status 37b which is the latest variable status which records the values of arguments and variables accessible to the subroutine at the end of the execution of the subroutine; the beginning call frame index 38b which records the index of the corresponding beginning call frame paired with the current end call frame.

Please note that, as mentioned earlier, if the subroutine calls or wait for a BFM to finish a bus transaction, the first simulation time recorded in the beginning call frame will be different from the second simulation time recorded in the ending call frame. Otherwise, the subroutine will be executed in zero simulation time, and the first simulation time recorded in the beginning call frame is the same as the second simulation time recorded in the ending call frame.

Figure 4A:
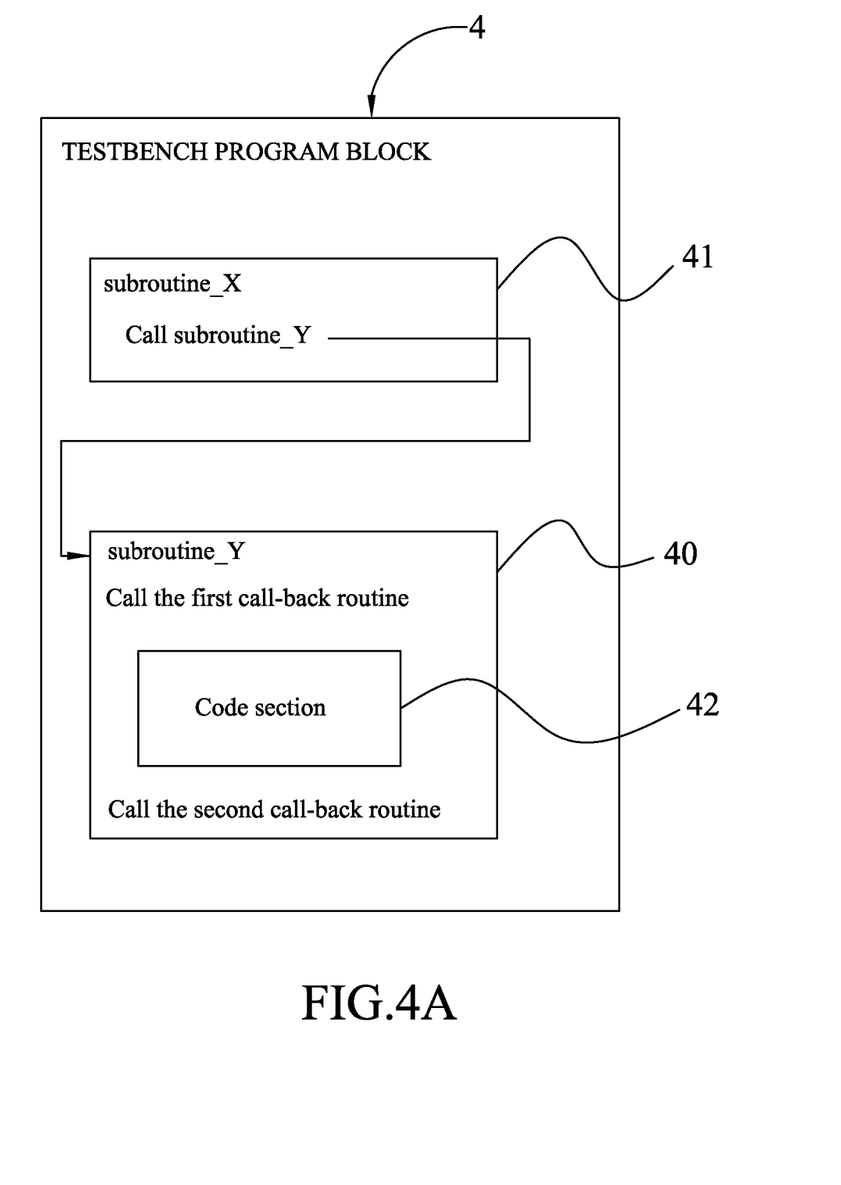
FIG. 4A is a simplified testbench program block to explain the call frame recording mechanism.
Figure 4B:
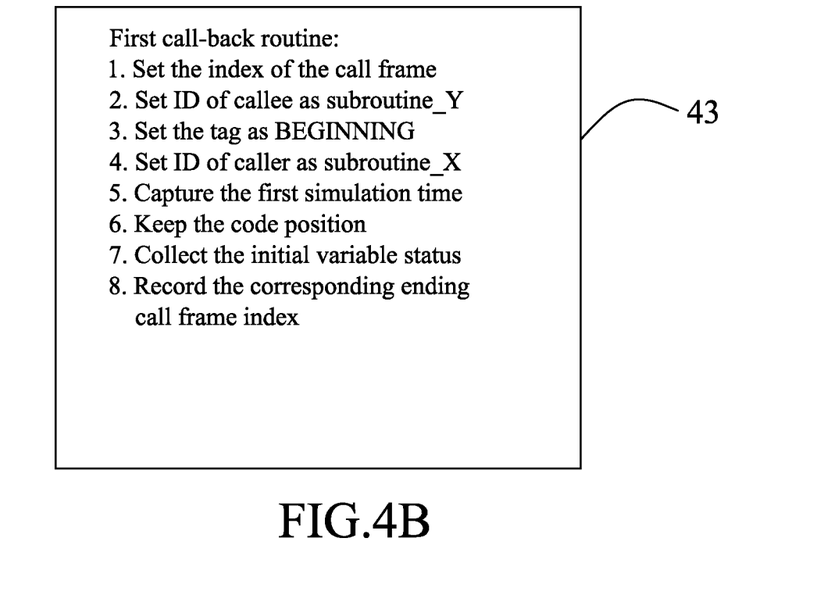
FIG. 4B illustrates the details of the first call-back routine.

Based on the definition of the call frame described above, an embodiment for performing this invention is provided to illustrate more details about recording the trace of call frames as shown in FIG. 4A. For instance, the testbench code includes a program block 4 and a subroutine_Y 40 which is called by subroutine_X 41. Before the subroutine_Y 40 is about to be executed, the first call-back routine 42 will be executed first, and a beginning call frame will be created by the first call-back routine 43, which is shown in FIG. 4B, to record the beginning information of the subroutine_Y 40 in the data structure of the beginning call frame. The information in the data structure includes: the index of the call frame; the identification of (callee) subroutine, subroutine_Y 40; the tag set as BEGINNING to indicate the beginning of the subroutine_Y 40; the first simulation time at which the first call back routine is executed; the identification of caller subroutine_X 41 which can be derived from call frame history; the initial variable status before entering the code section 42 of the subroutine_Y 40; and the ending call frame index which is temporarily set to zero and should be updated later when ending call frame index is available; the code position to indicate the line-number where the subroutine_Y 40 is called by subroutine_X 41; and a count to indicate the number of times subroutine_Y 40 is called at the line-number.

In one embodiment, the code position information can be obtained by using System Verilog Programming Interface (PLI) functions to query the simulator from the first call-back routine.

Consequently, a complete beginning call frame is constructed and can be recorded into the database.

Figure 4C:
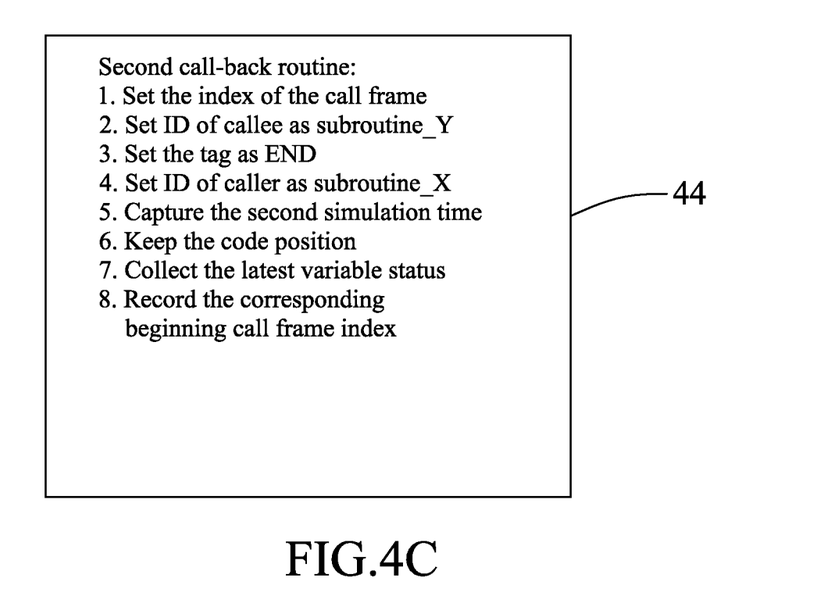
FIG. 4C illustrates the details of the second call-back routine.

After the code section 42 of subroutine_Y 40 is executed, the second call-back routine 44 will be executed and an ending call frame will be created by the second call-back routine 44, which is shown in FIG. 4C, to record the ending information of the subroutine_Y 40 in the data structure of the ending call frame. First, a part of data in the ending call frame is the same as in the corresponding beginning call frame, wherein the part of data includes: identification of the subroutine; identification of the caller subroutine; code position information, which can be filled into the ending call frame by the second call-back routine. Next, other information, which will be filled in the ending call frame by the second call-back routine 44, includes: the index of the call frame; the tag set as END to indicate the ending of the subroutine_Y 40 in the tag field of the ending call frame; the latest variable status of the subroutine_Y 40; the second simulation time at which the second call-back routine 44 is executed; and the beginning call frame index which is copied from the index of call frame field of the corresponding beginning call frame. Consequently, a complete ending call frame is constructed and can be recorded into the database. In addition, the ending call frame index field of the corresponding beginning call frame should be updated by copying the index field from the corresponding ending call frame. With the ending and beginning call frame indices available, the pairing relation between beginning and ending call frames can be easily identified. Another embodiment for deciding the pairing relation between beginning and ending call frames is to trace backwards to find the first beginning call frame which contains the same identification of the subroutine, identification of caller subroutine and code position information.

By repeatedly performing the step for all the subroutines as shown in FIG. 4, we can record an indexed series of call frames into the database for the entire simulation period.

Figure 5A:
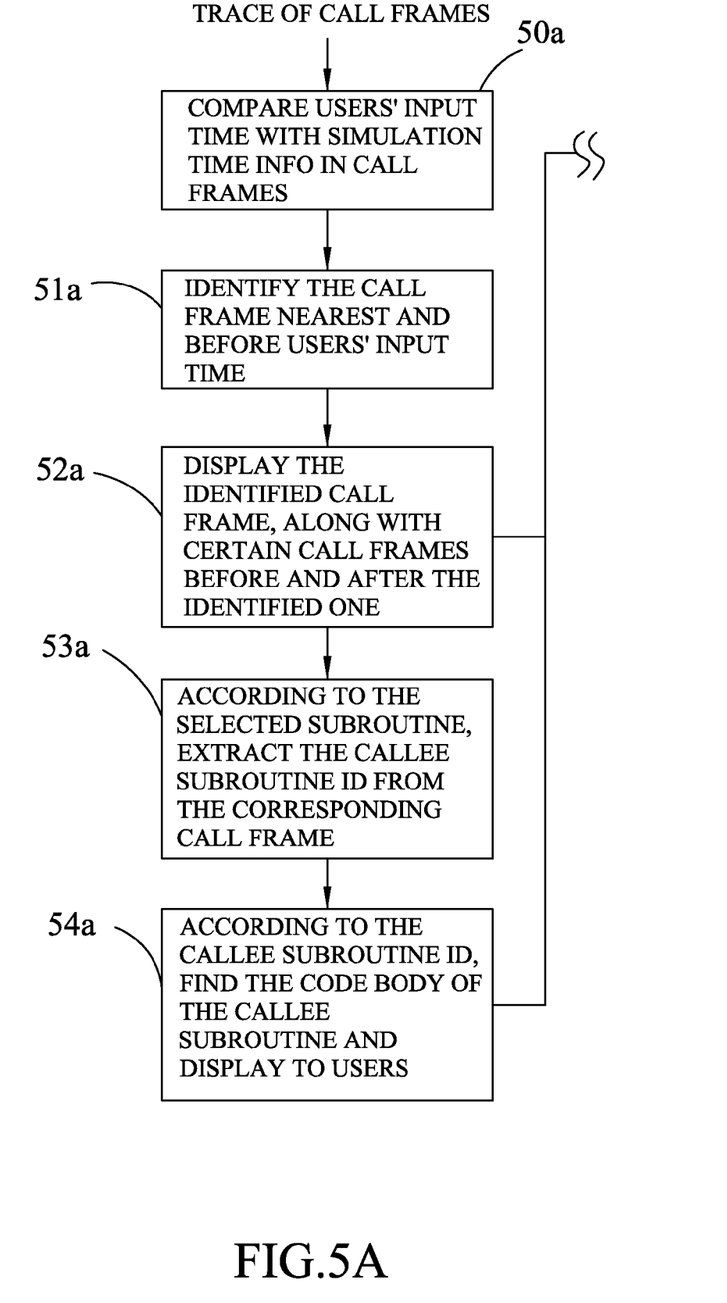
FIG. 5A and FIG. 5B illustrate a schematic flow chart to explain some use cases about call frame handling.
Figure 5B:
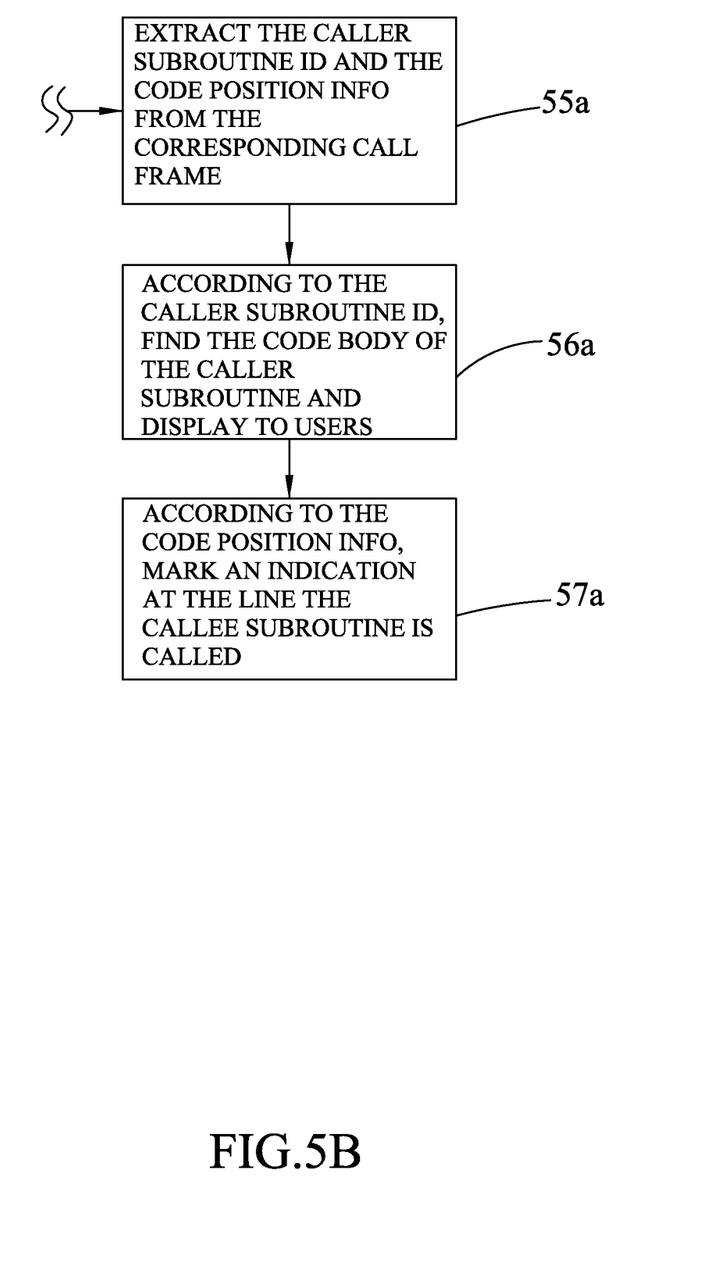

Frame Data Visualization:

FIG. 5A and FIG. 5B illustrate the details of how to use the recorded call frames and debugging information to help users to debug the testbench. For example, when users are interested in the call frames recorded at a particular simulation time, users can specify the time information by entering it in an input window or clicking at an icon which represents the simulation time and is located at the time axis of waveforms. In step 50a, once the time information is entered, a target call frame can be identified from the call frames recorded in the database, as illustrated in step 51a, by searching the first matched call frame which has the same simulation time as users specified. In step 52a, once the target call frame is found, some call frames located before or after the target call frame can be displayed in the graphic window as well.

Figure 6:
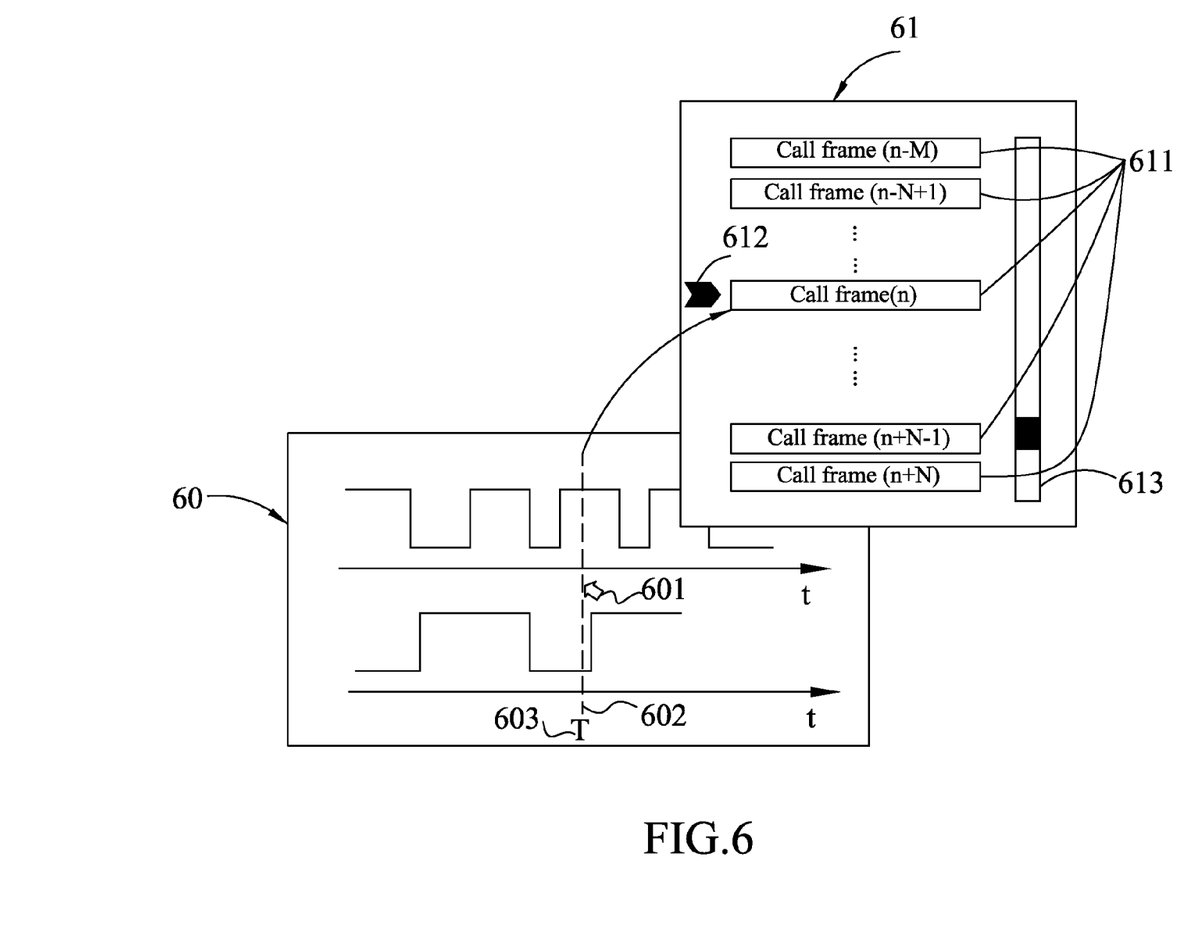
FIG. 6 illustrates an example of displaying call frames and waveforms in graphic windows.

FIG. 6 illustrates an example of displaying multiple graphic windows with a window 60 showing waveforms and another window 61 showing call frames. In the waveform window 60, when a mouse cursor 601 moves into the window 60, a vertical dotted line 602 will be invoked to align with and select a simulation time by moving a mouse cursor 601 onto one of the time stamps 603 on the waveform, which allow users to perform some time related operations to interact with other windows. In a call frame window 61, certain number of call frames 611 can be displayed in the order they were executed with the target call frame located around the center of the call frames and pointed by an arrow 612. Moreover, users can move scrollbar 613 up and down to trace the call frames for debugging the testbench.

Figure 7:
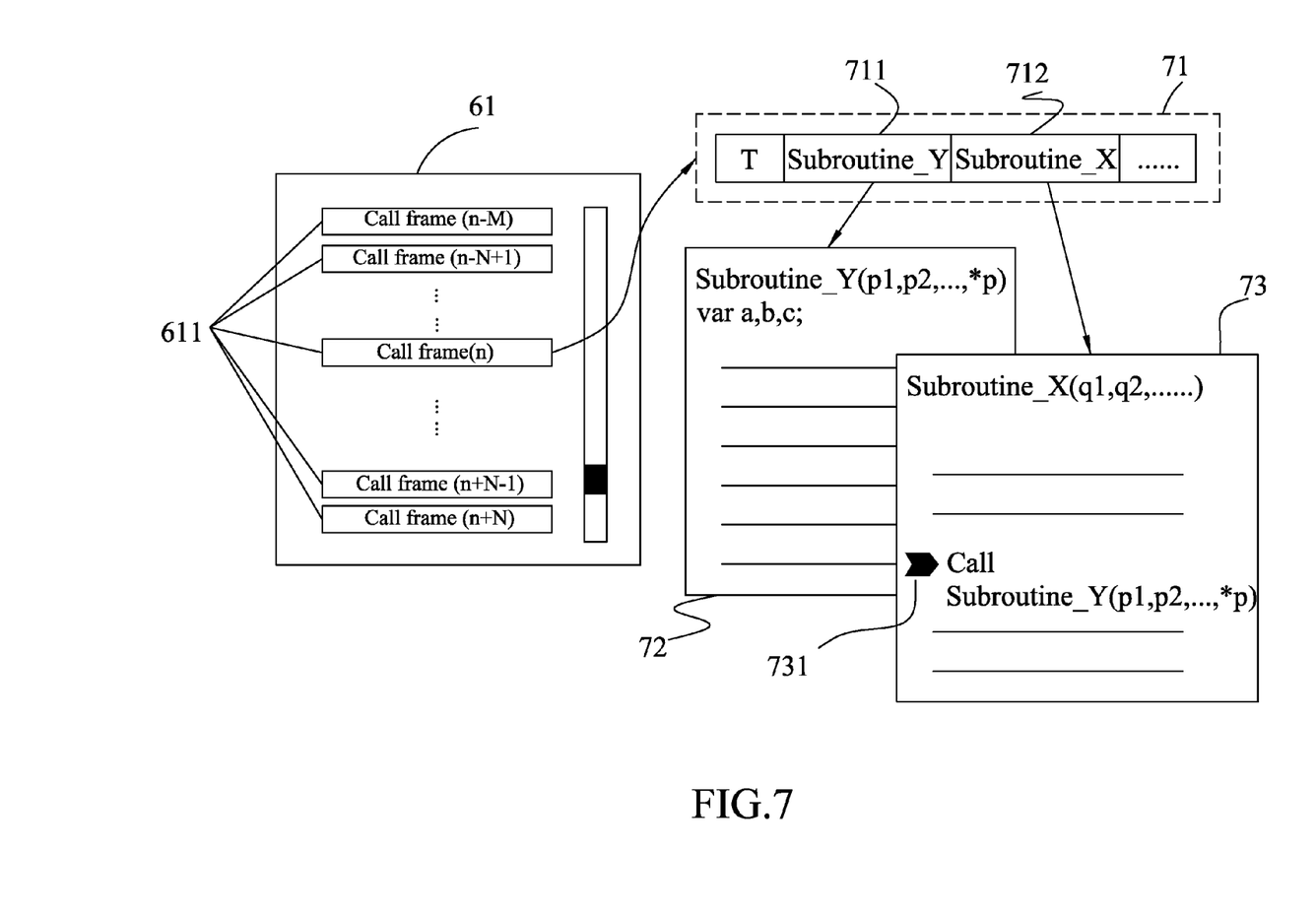
FIG. 7 is illustrates an example of displaying source code of subroutines in graphic windows.

Please refer back to FIG. 5A. Once the target call frame is identified, users can invoke and view the source code of the corresponding subroutine of the target call frame. In step 53a, when a call frame is selected, the corresponding callee subroutine ID can be extracted from the call frame to locate the source code of the callee subroutine. Consequently, as illustrated in step 54a, the source code of the callee subroutine can be displayed in a graphic window for users to view. FIG. 7 illustrates an example for displaying the source code in graphic windows. The call frame 71 can be zoomed in to view all the fields in the call frame, such as callee subroutine ID 711 and caller subroutine ID 712; and the callee subroutine ID 711 can be clicked by users to generate a graphic window 72 for viewing the source code.

Please refer back to FIG. 5B, which illustrates how users can trace back to the caller subroutine from the call frame of a callee subroutine which is called by the caller subroutine. In one embodiment, users can be provided an option menu with one of the options, say "trace back". In step 55a, after users choose the "trace back" option, the caller subroutine ID and the code position information are extracted from the call frame of the callee subroutine. An alternative way to obtain caller subroutine ID is to search the trace of call frames backward, starting from the call frame of the callee subroutine, to find the first call frame with a tag indicating that the subroutine begins but not ends yet. Once the call frame of the caller subroutine is found, the caller subroutine ID can be extracted and used to find the source code of the caller subroutine. In step 56a and 57a, the source code of the caller subroutine can be displayed in a graphic window with an arrow pointing to the line number where the callee subroutine is called.

FIG. 7 illustrates an example of displaying graphic windows, wherein a caller subroutine is shown in graphic window 73 and pointed by an arrow 731 to a line number where a callee subroutine is called. Furthermore, with the source code displayed in the graphic windows, users can choose to perform a "single step" command to execute the source code line by line to debug the testbench—since all the initial values of variables and arguments accessible to the subroutine are recorded in the call frame already—thereby allowing the subroutine to be re-executed to get the intermediate results line by line in the subroutine.

Another useful feature for users is to run the simulation virtually by using post-processing debugging. Users can set some breakpoint conditions to stop the virtual simulation at certain simulation time or event; and the simulation will be executed virtually by replaying the records saved in the database without running the real simulation of the circuit design with the testbench again. When one of the breakpoint conditions is met, the virtual simulation will be suspended; and all the related information, such as call frames, waveforms and corresponding source code, can be displayed in graphic windows with the breakpoint condition indicated.

In summary, all the abovementioned graphic windows, such as waveform windows, call frame windows and source code windows, can be activated simultaneously within one screen for users to view and debug the testbench code easily and effectively.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A computer-implemented method for recording a trace of call frames during a simulation of a circuit design with a testbench, wherein the testbench comprises a plurality of subroutines, wherein each subroutine of the plurality of subroutines comprises a code section, the method comprising using a computer to perform steps of:
    (a) for each subroutine of the plurality of subroutines, providing a first call-back routine which is called before the code section of the subroutine is executed;
    (b) starting the simulation of the circuit design with the testbench;
    (c) for each subroutine of plurality of subroutines, recording a first simulation time at which a corresponding first call-back routine of the subroutine is executed, a first tag indicating a beginning of the subroutine, and a first subroutine ID to identify the subroutine in a beginning call frame when the corresponding first call-back routine is called, and
    wherein the trace of call frames is formed according to an order of the call-back routines that are called one by one during an execution of the testbench at their respective simulation times.

2. The computer-implemented method according to claim 1, wherein the step (a) a further comprises a sub-step of:
    (a1) for each subroutine of plurality of subroutines, providing a second call-back routine which is called after the code section of the subroutine is executed; and wherein the step (c) further comprises a sub-step of:
    (c1) for each subroutine of plurality of subroutines, recording a second simulation time at which a corresponding second call-back routine of the subroutine is executed, a second tag indicating an ending of the subroutine, and a second subroutine ID to identify the subroutine in an ending call frame when the corresponding second call-back routine is called.

3. The computer-implemented method according to claim 2, wherein the testbench is written in SystemVerilog language and comprises a plurality of classes, wherein each of the plurality of classes comprises a plurality of variables and at least one method; and wherein the plurality of subroutines comprises the methods associated with the plurality of classes.

4. The computer-implemented method according to claim 3, wherein the step (c) further comprises recording a first variable status of a class of the subroutine in the beginning call frame when the corresponding first call-back routine is called.

5. The computer-implemented method according to claim 4, wherein the step (c1) further comprises recording a second variable status of the class of the subroutine in the ending call frame when the corresponding second call-back routine is called.

6. The computer-implemented method according to claim 3, wherein an invocation of the first call-back routine is provided by adding a call statement to call the first call-back routine at the beginning of each corresponding method of the class in the step (a).

7. The computer-implemented method according to claim 3, wherein the invocation of the second call-back routine is provided by adding a call statement to call the second call-back routine at the end of each corresponding method of the class in the step (a1).

8. The computer-implemented method according to claim 3, wherein each of the simulation times is obtained through programming language interface (PLI) of Verilog.

9. The computer-implemented method according to claim 2, wherein the step (c) further comprises recording a caller-subroutine ID to identify a caller subroutine that calls the subroutine and a position at which the subroutine is called in the beginning call frame when the corresponding first call-back routine is called.

10. The computer-implemented method according to claim 9, wherein the step (c1) further comprises identifying the corresponding beginning call frame of the ending call frame by searching back the call frames until a first matched call frame is found, wherein the first matched call frame has a tag to indicate a beginning of a subroutine, and the first subroutine ID recorded in the first matched call frame is the same as the second subroutine ID recorded in the ending call frame; and recording in the ending call frame the same caller-subroutine ID, and position at which the subroutine is called, as recorded in the first matched call frame.

11. The computer-implemented method according to claim 2, further comprising a step of:
(d) replaying the simulation according to a plurality of value change data associated with the call frames recorded in a database without actually running the simulation of the circuit design with the testbench.

12. The computer-implemented method according to claim 11, wherein the step (d) further comprises generating a graphic window to display a waveform of a plurality of value change data for a simulation time period according to the plurality of value change data recorded in the database.

13. The computer-implemented method according to claim 12, wherein the graphic window comprises an activation annotation to display the corresponding call frames recorded at a specified simulation time within the simulation time period.

14. The computer-implemented method according to claim 13, wherein the graphic window comprises an activation annotation to display a source file of the subroutine for the corresponding call frame recorded at the specified simulation time.

15. The computer-implemented method according to claim 14, wherein the graphic window comprises an activation annotation to single step through the subroutine while viewing the source file of the subroutine.

16. The computer-implemented method according to claim 13, wherein the graphic window comprises an activation annotation to display a source file of the caller subroutine for a subroutine associated with a first call frame recorded at the specified simulation time according to the caller-subroutine ID and the position at which the subroutine is called in the first call frame.

17. The computer-implemented method according to claim 13, further comprising a step of:
(e) setting a breakpoint and generating the graphic window containing the breakpoint according to the plurality of value change data and the call frames recorded in the database without running the simulation of the circuit design with the testbench.

18. The computer-implemented method according to claim 2, wherein the testbench is written in SystemVerilog; and wherein the plurality of call-back routines comprises a plurality of C (C++) functions, and the plurality of C (C++) functions are called from the SystemVerilog simulation kernel through programming language interface (PLI) of Verilog.

19. The computer-implemented method according to claim 18, wherein the first and second call-back routines are provided by registering the call-back routines through programming language interface (PLI) of Verilog in the step (a) and step (c), respectively.

20. The computer-implemented method according to claim 2, wherein the step (c) further comprises recording an index of a call frame in the beginning call frame when the corresponding first call-back routine is called.

21. The computer-implemented method according to claim 20, wherein the step (c1) further comprises recording the index associated with the beginning call frame in the ending call frame when the corresponding second call-back routine is called.

22. A computer-implemented method for debugging a testbench, wherein the testbench comprises a plurality of subroutines, the method comprising using a computer to perform steps of:
(a) providing and executing a recording routine to log trace data for each subroutine of the plurality of subroutines, which are to be executed one by one, at their respective simulation times while running a simulation with the testbench; and
(b) replaying executions of the plurality of subroutines using the logged trace data recorded at the simulation times without rerunning the simulation.

23. The computer-implemented method according to claim 22, wherein the testbench is written in SystemVerilog language and comprises a plurality of classes, wherein each of the plurality of classes comprises a plurality of variables and at least one method; and wherein the plurality of subroutines comprises the methods associated with the plurality of classes.

* * * * *